United States Patent [19]

Herman et al.

[11] Patent Number: 4,535,251
[45] Date of Patent: Aug. 13, 1985

[54] A.C. SOLID STATE RELAY CIRCUIT AND STRUCTURE

[75] Inventors: Thomas Herman, Redondo Beach; Oliver Williams, Camarillo, both of Calif.

[73] Assignee: International Rectifier Corporation, Los Angeles, Calif.

[21] Appl. No.: 451,792

[22] Filed: Dec. 21, 1982

[51] Int. Cl.³ .............................................. G02B 27/00
[52] U.S. Cl. ...................................... 250/551; 307/311
[58] Field of Search ................. 250/551, 239; 307/311; 357/30, 39, 76, 17, 68

[56] References Cited

U.S. PATENT DOCUMENTS

| | | | |
|---|---|---|---|
| 4,110,781 | 8/1978 | Konishi et al. | 250/551 |
| 4,316,103 | 2/1982 | Nathanson | 307/311 |
| 4,361,798 | 11/1982 | Tolmie, Jr. | 307/311 |

Primary Examiner—David C. Nelms
Assistant Examiner—J. Jon Brophy
Attorney, Agent, or Firm—Ostrolenk, Faber, Gerb & Soffen

[57] ABSTRACT

A solid state a.c. relay has two separate and indentical power thyristors connected in anti-parallel arrangement. The power thyristors are optically switched, lateral conduction devices with anode and cathode electrodes on the same surface. Both are switched by illuminating their surface by reflected illumination from an LED. Each thyristor is provided with a respective control circuit which includes a MOSFET transistor for clamping its respective thyristor gate wherever the voltage across the thryistor exceeds a given absolute value or whenever there is a high dV/dt transient across the thyristor. The control circuit for the control transistor includes a capacitance divider, one element of which is the distributed capacitance of the control transistor. The control circuit components can be integrated into the same semiconductor chip which contains the respective power thyristor. Each of the two identical power chips and the LED chip are spaced from one another and mounted on an alumina substrate. Two lead wires are stitch-bonded to the electrode pads of the two chips to connect them in anti-parallel relation, and are then stitch-bonded to two respective conductive sections on the alumina substrate. The chips and the LED are covered with a cap having a reflective interior so that illumination from the LED is reflected toward the chip surfaces. The interior of the cap is filled with a transparent plastic. The assembly is housed in either a single in-line pin housing or dual in-line pin housing and the entire housing is suitably encapsulated.

24 Claims, 6 Drawing Figures

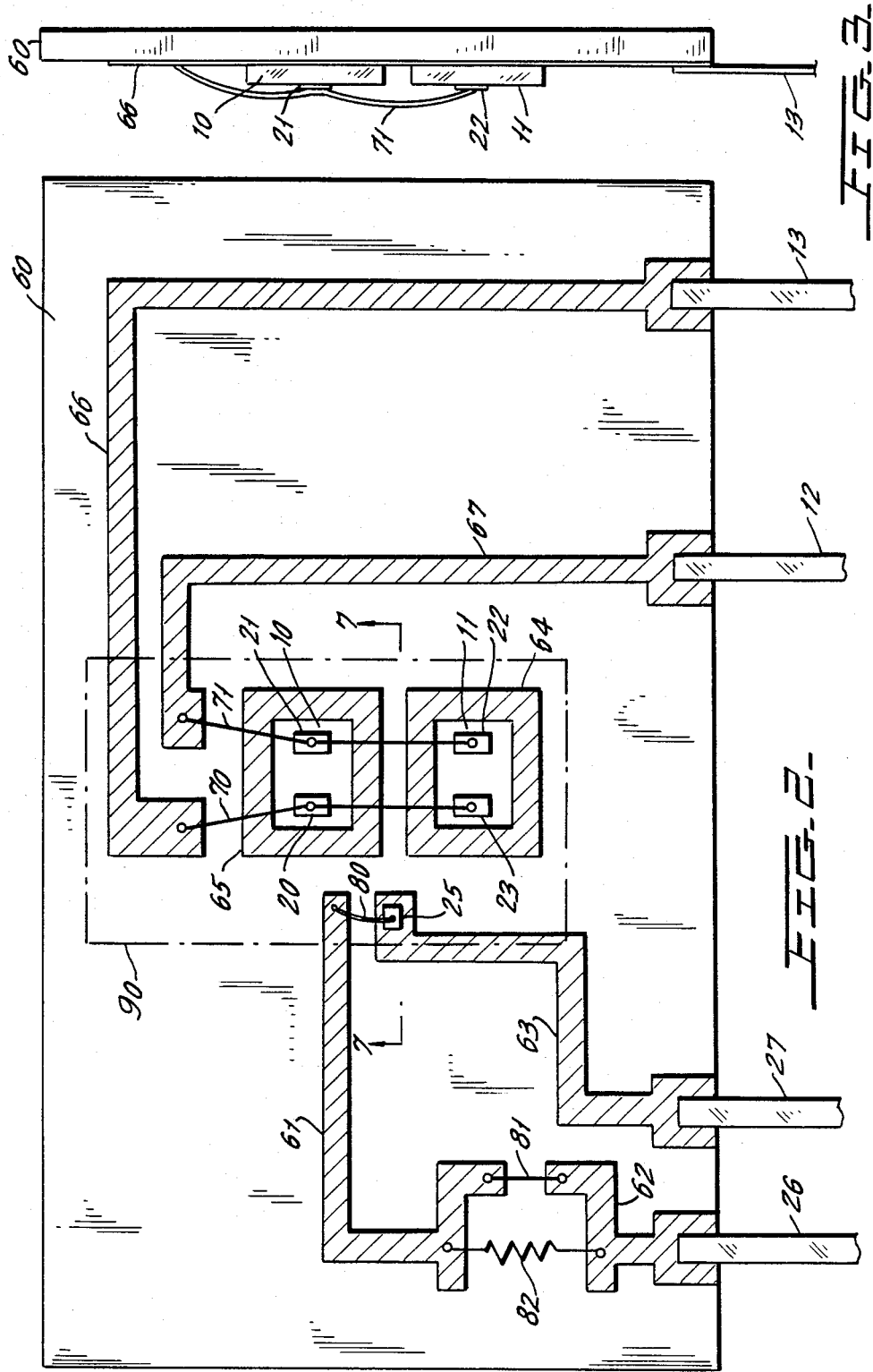

A.C. SOLID STATE RELAY CIRCUIT AND STRUCTURE

BACKGROUND OF THE INVENTION

This invention relates to a.c. solid state relays, and more specifically relates to a novel solid state relay circuit and housing therefor.

Solid state a.c. relays are well known. Such relays, with optical isolation between input and output, are also well known. In presently existing devices, many discrete components are commonly required to complete the a.c. circuit. Thus, it may take thirty or more discrete thyristors, transistors, resistors and capacitors to manufacture a single device. Attempts have been made to integrate the various parts of the entire solid state relay, but these have met only limited success due to the mix of high voltage and high power components.

Solid state relays made in the past have also employed zero voltage crossing circuits to ensure turn on of the thyristor only when the a.c. voltage is within some small "window". These circuits have also been relatively complex and difficult to integrate into the main power chip. Thus, zero cross firing circuits have required the use of a discrete resistor connected across the power terminals. These resistors have not been easily integrated into a single chip because of the difficulty of forming this resistor on the chip surface.

It has also been difficult to provide so-called "snubberless" operation for the relay under any inductive or resistive load. Thus, while solid state relays may operate well under resistive or slightly inductive loads, they may tend to "half wave" or "chatter", which is a condition wherein a relay turns on only for one-half of a cycle, under a highly inductive load. This has occurred in the past because the relays are commonly provided with conditioning circuits for suppressing fast turn on of the circuit under some fast transient or high dV/dt condition. When the device is operated under a very highly inductive load, however, voltage transients are commonly generated repetitively during device turn on. When the signal conditioning circuit misinterprets this as a transient signal, it shuts off the power output during a particular half phase of the operation. The circuit will then appear to turn to normal during the next half wave and the relay will turn on. This condition repeats so that the relay turns on only during one or another of the half waves of the full cycle. To avoid this condition, relays of the past have been formed with reduced firing sensitivity and this has required reduction of sensitivity to optical firing.

Since prior art relays have been relatively complex, they have required substantial volume for their housings. Moreover, solid state relays of the past have been limited to a maximum temperature rise of about 110° C., thus limiting their current-handling capability. Finally, solid state relays of the past have been relatively expensive in view of the need for large numbers of discrete components and large housings.

BRIEF DESCRIPTION OF THE INVENTION

In accordance with the present invention, two identical thyristor power chips are provided for an a.c. relay wherein the power chips are both of lateral construction with both cathode and anode electrodes at one surface of each device and wherein each of the chips can be optically fired and has an optically sensitive upper surface which, when illuminated, will permit the device to become conductive between its anode and cathode electrodes.

The gate circuit of each of the thyristors is connected to a novel control circuit, formed either of discrete components or of components merged within the body of the semiconductor material forming the thyristor. The control circuit is operable to prevent turn on, even though the surface is illuminated, when the voltage across the device exceeds a value greater than some predetermined window value, or when high dV/dt transients appear across the device. This control circuit includes a clamping transistor which can be turned on to clamp the gate of its respective thyristor and a capacitive divider circuit connected across the main power electrodes. The capacitive divider applies a control signal to the control transistor.

One of the capacitors of the capacitive divider includes the distributed capacitance of the control transistor. So long as the control transistor is on, its respective power thyristor cannot turn on even though its surface is illuminated. The capacitive divider is arranged so that the control transistor is normally turned on for all absolute voltages across the main device greater than some relatively small window value. Thus, the power thyristor cannot turn on outside of this small window value or zero cross value.

The novel capacitance divider, in combination with the control transistor, will now operate to suppress both fast transients and still allow the device to function under its normal load condition. Thus, voltage transients which are generated repetitively during device turn on under highly inductive load conditions will not be misinterpreted as a fast transient and the power thyristor chip will be permitted to turn on in its normal manner under even highly inductive loads.

The novel signal conditioner of the invention also allows for substantial improvement in optical sensitivity of the device without misfiring. Note that currently available optically isolated triac drivers and the like are always limited either in dV/dt capability or optical sensitivity because of their inability to separate low level command signals from transients.

A novel housing is provided for the two chip arrangement in which the two chips are easily and inexpensively connected in parallel with one another and are protected from the outer environment. An alumina substrate or other suitable heat conductive but electrically insulative substrate is provided with suitable conductive patterns thereon for receiving the various chips of the switch and for connecting the chip electrodes to suitable output leads. The two identical thyristor chips which are to be connected in anti-parallel are symmetrically secured to respective conductive pads on the substrate and are in alignment with one another and with the terminal ends of two conductive patterns on the substrate. Two continuous wires are then stitch-bonded to the thyristor pads and conductive leads in such a manner that one lead wire is electrically connected to the anode pad of one chip, the cathode pad of the second chip and one of the conductive patterns which is connected to an input a.c. lead. The other wire is similarly connected to the other electrodes and conductive pattern to conduct the thyristors in anti-parallel.

A small LED chip is also connected to the alumina substrate at the same time the power chips are connected. The LED is connected appropriately to two input leads which are well insulated from the a.c. output leads.

A plastic cap of a white illumination reflecting material then is secured to the substrate and covers the region of the substrate containing the LED and the two power chips. The interior of this cap may be filled with a transparent plastic which encloses and encapsulates the surfaces of the chips and their interconnecting leads.

If the control circuit for the power transistor is carried out in discrete form, the discrete components may also be suitably connected to this substrate. Preferably, however, these components are integrated into the individual power chips so that the entire solid state relay will consist of two power chips and their controls, the LED chip and the various support structures previously described.

BRIEF DESCRIPTION OF THE DRAWINGS

FIG. 2 illustrates the two power thyristor chips of FIG. 1 and an LED mounted on a ceramic substrate.

FIG. 3 is a side view of FIG. 2.

DETAILED DESCRIPTION OF THE DRAWINGS

Figure 1:
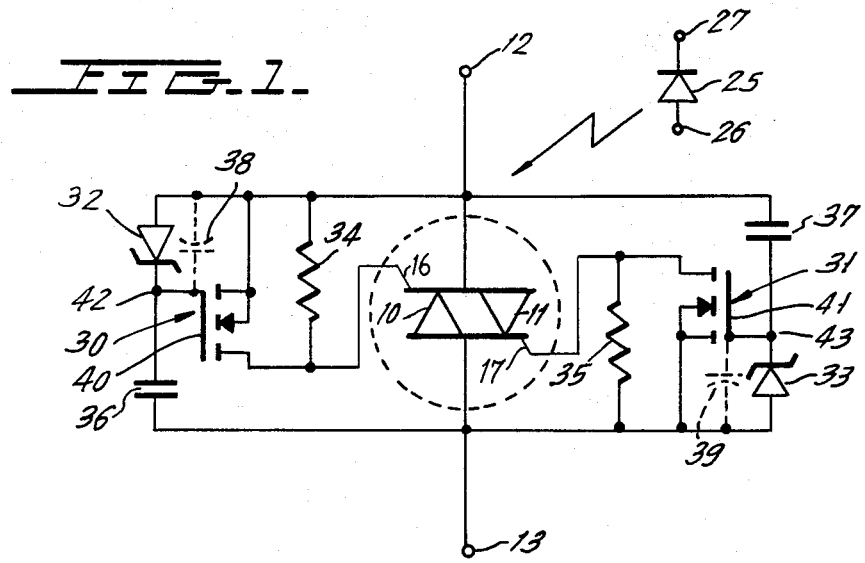
FIG. 1 is a circuit diagram of the novel a.c. solid state relay of the invention.

Referring first to FIG. 1, there is shown a circuit diagram of the full a.c. relay of the present invention. The relay of FIG. 1 employs two thyristors 10 and 11 connected in anti-parallel relationship with respect to one another between main a.c. power terminals 12 and 13, respectively. Thyristors 10 and 11 are provided with gate circuits schematically illustrated by the gates 16 and 17, respectively. The two thyristors 10 and 11 are preferably implemented on separate identical power chips shown as the power chips 10 and 11 in FIGS. 2, 3 and 6. Each of the thyristors may be constructed in any desired manner but preferably are optically fired thyristors having a lateral construction in that both anode and cathode electrodes are on the same surface of their chip. Thus, chip 10 has, on its upper surface, anode electrode pad 20 and cathode electrode pad 21, while chip 11 has an identical anode pad 22 and cathode pad 23. The gates 12 and 13 of FIG. 1 are not seen in FIG. 2, and may not be externally accessible. However, the devices may be discrete thyristors with suitable external gate electrodes.

Since each half of the circuit of FIG. 1 is preferably carried out with all circuit components integrated into a common chip, a gate electrode is not available on the exterior of the chip but connections are made interiorly of the chip junctions. Clearly, all discrete components could be used, if desired.

Thyristors 10 and 11 are electrically connected together so that anode 20 of one is connected to cathode 23 of the other and so that anode 22 of one is connected to cathode 21 of the other. Thus, the devices are connected in the anti-parallel relationship shown in FIG. 1.

A suitable LED 25, which can be a conventional commercially available gallium aluminum arsenide device having terminals 26 and 27 in FIG. 1, is arranged as will be later described to flood the photosensitive surfaces of chips 10 and 11 in order to permit turn on of the chips if other circuit conditions are appropriate. Good electrical isolation is provided between the input circuit connected to terminals 26 and 27 and the power circuit to terminals 12 and 13.

Identical control circuits for controlling the turn on of thyristors 10 and 11 respectively includes respective MOSFET transistors 30 and 31, zener diodes 32 and 33, resistors 34 and 35 and capacitors 36 and 37. Capacitors 36 and 37 serve as one component of the respective capacitive dividers. The second component of the capacitive dividers consists of the distributed capacitance 38 and 39 of devices 30 and 31, respectively.

As pointed out above, the circuit components 30-39 could be implemented as discrete components. Preferably, however, these circuit components are implemented integrally with the semiconductor chips defining thyristors 10 and 11. This is possible since the components are few in number and since there is no resistor extending across the main terminals of the device.

Transistors 30 and 31 are connected to the gates 16 and 17 of thyristors 10 and 11, respectively. So long as transistors 30 and 31 conduct, or are on, the application of illumination to the surfaces of devices 10 and 11 from LED 25 cannot turn on the device. Transistors 30 and 31 will turn on when their respective gates 40 and 41 are appropriately charged to a suitable threshold voltage $V_{th}$. Thus, when the nodes 42 and 43 reach the threshold turn on voltage of transistors 30 and 31, respectively, and if suitable drain to source voltage is provided, the devices will conduct and clamp the respective gates 16 and 17 of thyristors 10 and 11.

The voltage at each of nodes 42 and 43, termed $V_0$, will be $$V_0 = V_{cc}C_p/(C_1+C_p).$$

In the above, $V_{cc}$ is the voltage across terminals 12 and 13, $C_p$ is the capacitance of distributed capacitors 38 and 39, respectively, and $C_1$ is the capacitance of capacitors 36 and 37, respectively.

From the above, it will be seen that the voltage $V_0$ at nodes 42 or 43 will be greater than the threshold voltage of the tansistors 30 and 31 when the instantaneous a.c. voltage between terminals 12 and 13 is more positive, or is more negative than some "window" value. Consequently, transistors 30 and 31 clamp thyristors 10 and 11 when this window voltage is exceeded. This arrangement then permits a zero detection circuit without requiring a resistor extending between the main terminals of the device.

The novel capacitive divider circuit is also useful in suppressing the firing of devices 10 and 11 due to fast rising pulses such as transient noise or high dV/dt signals. Such high transient pulses will apply a suitably high voltage across parasitic capacitances 38 and 39 that the transistors 30 and 31 respectively turn on to clamp its respective thyristor. Thus, the thyristor will not be fired in response to fast rising transient pulses.

For relatively slow rising pulses, such as those produced by highly inductive loads connected to the relay terminals 12 and 13, these pulses will not be sufficiently fast to turn on the control transistors and unintentionally clamp the thyristors 10 and 11, thereby to avoid single phasing or chattering of the relay on highly inductive loads. Note also that this is accomplished without having to reduce the optical sensitivity of the device. Thus, the thyristors 10 and 11 can be disigned to have optimum optical sensitivity for firing without concern for false operation by relatively slow rising transients.

A further advantage of the circuit shown in FIG. 1 is in the design of resistors 34 and 35. Thus, the temperature coefficient of the resistor is balanced against the sensitivity of its respective thyristor. That is, if the resistor has the usual negative temperature coefficient, it is possible that the resistor would clamp its respective controlled rectifier when hot. However, by balancing the resistance coefficient of resistors 34 and 35, this clamping action can be avoided.

There is next described in FIGS. 2, 3, 4, 5 and 7 a first structure for housing the chips 10 and 11 and LED 25 of FIG. 1 wherein the control circuit components for each of the thyristors 10 and 11 are integrally formed within its respective thyristor chip. Referring first to FIGS. 2 and 3, there is shown a ceramic substrate support 60 which can be of alumina but may be of any desired electrically insulative, thermally conductive material. By way of example, the alumina slab 60 can have a thickness of 0.025 inch, a length of about 0.9 inch and a width of about 0.5 inch. A plurality of conductive patterns is formed on one surface of substrate 60, including patterns 61 to 67. Each of these patterns may be formed by gold plating onto the substrate where the gold plating has a thickness greater than about 150 microinches. Each of thyristor chips 10 and 11 is then suitably soldered or otherwise mounted down onto conductive pads 65 and 64, respectively, so as to be in good thermal contact with the alumina body 60. Each of the chips 10 and 11 may have a size of approximately 82 X 116 mils for a typically sized device. The LED chip 25 is mounted down on one end of conductive pattern 63.

Chips 10 and 11 are so mounted that their anode and cathode leads are generally in line with one another and with one end of conductive patterns 66 and 67. Consequently, one single wire 70 is conveniently used to electrically connect conductive pads 23 of thyristor 11 and 20 of thyristor 10 and the ends of conductive pattern 66. This can be done in a stitch-bonding process of relatively simple nature which lends itself to high speed automated techniques. Thus, a bonding head is simply brought down onto the wire 70 to electrically attach the wire at the three spaced points corresponding to the location of pads 23, 20 and the end of conductor 66. In a similar manner, a second parallel wire 71 is stitch-bonded to conductive pads 22, 21 and the end of conductive pattern 67. The stitch-bonding of conductor 71 is shown in FIG. 3 in more detail. Each of conductive wires 70 and 71 may be of aluminum wire having a diameter of about 6 mils.

As a result of the above, the power terminals 12 and 13 are connected to the thyristor devices 10 and 11 in FIG. 2 in the manner shown in FIG. 1 with the thyristors in anti-parallel relationship with respect to one another. Note that, since the chips 10 and 11 will also contain their respective control circuits, the control circuits are also connected in place with this single stitch-bonding operation.

The LED 25 is shown disposed atop one end of conductive pattern 63 which is connected to lead 27. The other lead of LED 25 is electrically connected to one end of conductive pattern 61 by the wire 80. Wire 80 which may be an extending lead of the LED 25 is bonded to the end of conductive pattern 61 in any desired manner.

Conductive pattern 61 is then electrically connected to spaced conductive pattern 62 either by the direct shorting connection of wire 81 or by a resistor 82. The selection of the shorting wire 81 or resistor 82 depends upon the power available at terminals 26 and 27 and the characteristics of the LED 25. Wires 80 and 81 may be gold wires having diameters of about 1 mil. Note that the leads 12, 13, 26 and 27 all extend out from one edge of the periphery of substrate 60, to define a single in-line pin type of package, as will be later described.

Figure 4:
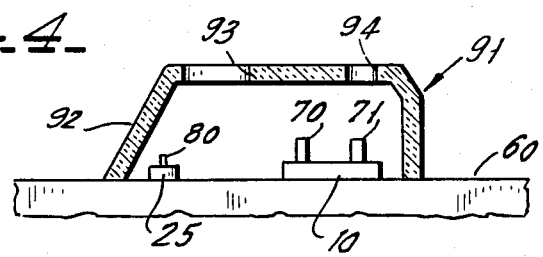
FIG. 4 is an elevation view of the assembly of FIG. 2 with an enclosing cap for enclosing the LED and power chips.
Figure 5:
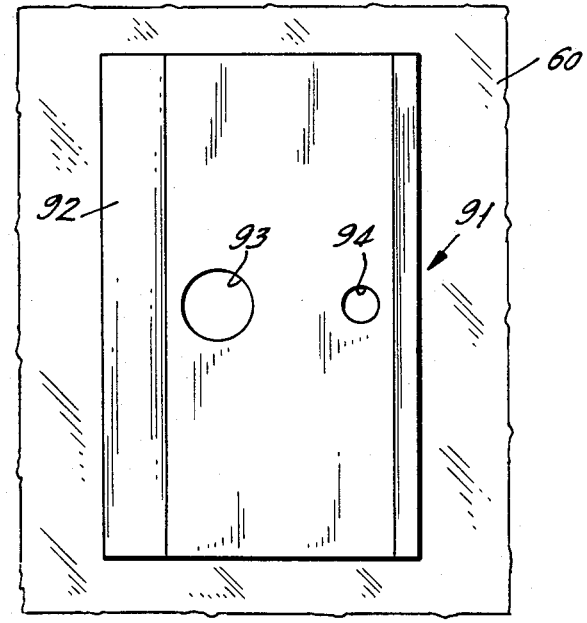
FIG. 5 is a top view of FIG. 4.

An optical cap 91 is then placed atop the LED 25 and thyristors 10 and 11 and encloses the area shown in dot-dash lines 90 in FIG. 2. The cap is shown in FIGS. 4 and 5 as cap 91 and may be composed of any desired reflective plastic material capable of withstanding the temperatures which are produced during device operation. A white colored plastic has been used. The plastic selected may be disuphone. The plastic preferably is white so that light will reflect form its interior surface. The cap can consist of a suitable silicone such as RTV having titanium oxide powder mixed therein. The titanium oxide powder uniquely remains in dispersion within the silicone. The mixture can be oven cured at about 115° C. for about 15 minutes.

The cap 91 has a sloped side 92 above the location of the LED 25 with this sloped edge tending to reflect light toward the region of the chips 10 and 11, as can be seen in FIG. 4.

Cap 91 can be cemented in place, as shown in FIG. 4 or if desired, can be arranged to overlap the substrate and snap over the substrate edge. A clear silicone is then loaded into the interior of cap 92 through the filling holes 93 and 94 of FIGS. 4 and 5 in order to completely encapsulate all of chips 25, 10, 11 and their connecting leads while permitting illumination from LED 25 to reach the photosensitive surfaces of thyristor chips 10 and 11.

After the cap 91 is secured in place and filled with silicone, the entire substrate 60 along with the cap 91 can be suitably encapsulated in any protective insulation sheath through which the leads 12, 13, 26 and 27 extend to define an SIP type of package of relatively small size and volume. The device, however, will be capable of a continuous current rating of $1\frac{1}{2}$ amperes or greater at voltages of 240 volts a.c.

Figure 6:
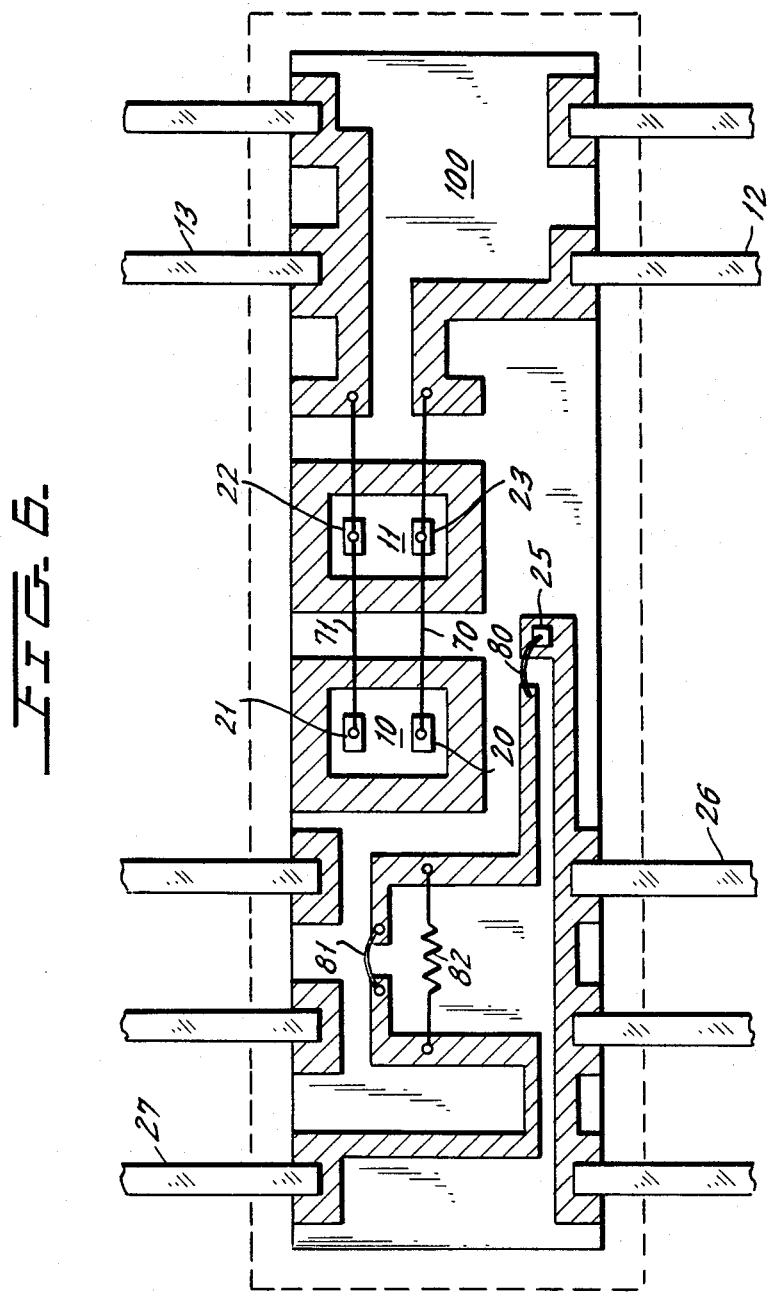
FIG. 6 shows a ceramic substrate support for the circuit of the invention wherein the support is to be used in a dual in-line pin package.

The novel arrangement of the invention can also be housed within a support structure adapted for a dual in-line pin housing. Thus, as shown in FIG. 6, where components similar to those previously described have identical numerals, the chips 10 and 11 and the LED 25 are mounted on conductive pads shown in crosshatching and are electrically connected to the various pins 12, 13, 26 and 27 in the manner shown. In FIG. 6, the alumina substrate 60 of FIG. 2 is replaced by substrate 100. The conductive pattern on substrate 100 is arranged so that the terminals 12, 13, 26 and 27 are on opposite sides of the chip as in the conventional dual in-line package. A cap which may be identical to cap 91 will enclose the chips 10, 11 and 25 in FIG. 6 in the manner previously described. The substrate may then be mounted within a lead frame which provides the leads 12, 13, 26 and 27 and the other leads shown in FIG. 6. The device may then be completely housed within a molded housing which could, for example, be formed by a transfer molding process or the like.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A solid state a.c. relay comprising first and second thyristors each having respective anode and cathode electrodes and a respective gate circuit; each of said thyristors being formed in separate respective first and second semiconductor chips and being of the lateral conductivity type, wherein said anode and cathode electrodes of each of said thyristors are on the same first surface of their said first and second chips respectively; said first surface of said first and second chips being optically sensitive, whereby said first and second chips can be switched to conduct current by illuminating said one surface; said solid state relay further comprising a light emitting diode arranged to illuminate said first surfaces upon its energization; a pair of a.c. terminals; said anode and cathode electrodes of said first and second thyristors connected to said pair of a.c. terminals and in anti-parallel relation with one another; a pair of control terminals insulated from said a.c. terminals and connected to said light emitting diode; and first and second control circuits connected to said gate circuits of said first and second thyristors respectively for clamping said first and second gate circuits respectively to prevent firing of said first and second thyristors when the voltage between said pair of a.c. terminals exceeds a given value and for clamping said first and second gate circuits in response to transient pulses having a dV/dt greater than a given value.

2. The solid state relay of claim 1, wherein said first and second control circuits include first and second control transistors respectively, each having an output circuit and a transistor control circuit operable to switch its respective control circuit between a conductive and a nonconductive condition; and first and second capacitor dividers; said first and second transistor output circuits connected between said gate circuit and said cathode electrode of its respective one of said first and second thyristors, whereby, when said first or second transistor output circuit is conductive, the respective one of said first or second thyristors cannot fire in response to illumination of its said first surface; said first and second capacitor dividers connected across said pair of a.c. terminals and having respective nodes between capacitors connected to said control circuit of the respective control transistor, whereby the voltage at said nodes renders its respective transistor conductive so long as the voltage between said pair of a.c. terminals exceeds a given value to prevent turn on of the respective one of said thyristors when the a.c. voltage exceeds a given window voltage, and whereby fast rising transient pulses turn on said transistors for their duration to prevent turn on of said thyristors by transient high dV/dt pulses.

3. A solid state relay comprising first and second thyristor chips connected in anti-parallel relation, and having respective anode and cathode electrodes and respective gate circuits; each of said first and second thyristors having one surface which is optically sensitive, whereby said first and second chips can be switched to conduct current by illuminating said one surface; said solid state relay further comprising a light emitting diode arranged to illuminate said one surface upon its energization; a pair of a.c. terminals; said first and second thyristors connected to said pair of a.c. terminals and in anti-parallel relation with one another; a pair of control terminals insulated from said a.c. terminals and connected to said light emitting diode; first and second control circuits connected to said gate circuits of said first and second thyristors respectively for clamping said first and second gate circuits respectively to prevent firing of said first and second thyristors when the voltage between said pair of a.c. terminals exceeds a given value and for clamping said first and second gate circuits in response to transient pulses having a dV/dt greater than a given value; said first and second control circuits including first and second control transistors respectively, each having an output circuit and a transistor control circuit operable to switch its respective control circuit between a conductive and a nonconductive condition; and first and second capacitor dividers; said first and second transistor output circuits connected between said gate circuit and said cathode electrode of its respective one of said first and second thyristors, whereby, when said first or second transistor output circuit is conductive, the respective one of said first or second thyristors cannot fire in response to illumination of its said first surface; said first and second capacitor dividers connected across said pair of a.c. terminals and having respective nodes between capacitors connected to said control circuit of the respective control transistor, whereby the voltage at said nodes renders its respective transistor conductive so long as the voltage between said a.c. terminals exceeds a given value to prevent turn on of the respective one of said thyristors when the a.c. voltage exceeds a given window voltage, and whereby fast rising transient pulses turn on said transistors for their duration to prevent turn on of said thyristors by transient high dV/dt pulses.

4. The solid state relay of claim 2 or 3, wherein said first and second control circuits further include first and second zener diodes respectively connected from said nodes of said first and second capacitor dividers respectively to the cathode electrodes of said first and second thyristors respectively.

5. The solid state relay of claim 2 or 3, which further includes first and second resistors connected between said gate circuit of said first and second thyristors respectively to the cathode electrode of said first and second thyristors respectively.

6. The solid state relay of claim 4, which further includes first and second resistors connected between said gate circuit of said first and second thyristors respectively to the cathode electrode of said first and second thyristors respectively.

7. The solid state relay of claim 2 or 3, wherein said first and second transistors are metal oxide semiconductor field effect transistors and wherein said transistor control circuits include the gate circuit of said transistors.

8. The solid state relay of claim 4, wherein said first and second transistors are metal oxide semiconductor field effect transistors and wherein said transistor control circuits include the gate circuit of said transistors.

9. The solid state relay of claim 5, wherein said first and second transistors are metal oxide semiconductor field effect transistors and wherein said transistor control circuits include the gate circuit of said transistors.

10. The solid state relay of claim 6, wherein said first and second transistors are metal oxide semiconductor field effect transistors and wherein said transistor control circuits include the gate circuit of said transistors.

11. The solid state relay of claim 2 or 3, wherein said first and second capacitor dividers comprise first and second capacitors connected at said node.

12. The solid state relay of claim 4, wherein said first and second capacitor dividers comprise first and second capacitors connected at said node.

13. The solid state relay of claim 5, wherein said first and second capacitor dividers comprise first and second capacitors connected at said node.

14. The solid state relay of claim 6, wherein said first and second capacitor dividers comprise first and second capacitors connected at said node.

15. The solid state relay of claim 7, wherein said first and second capacitor dividers comprise first and second capacitors connected at said node.

16. The solid state relay of claim 15, wherein said second capacitor of each of said first and second capacitor dividers is the distributed capacitance of said first and second transistors respectively.

17. The solid state relay of claim 1, which further includes an electrically insulative but thermally conductive ceramic substrate for mounting said first and second chips and said light emitting diode; said first and second chips and said light emitting diode being fixed to the same surface of said substrate and spaced from one another; said optically sensitive surfaces of said first and second chips facing away from said substrate; said light emitting diode being in a position which enables illumination of said first and second chips by reflection of its light output from reflecting surfaces.

18. The solid state relay of claim 17, which includes first and second conductive strips on said substrate which extend to first and second output terminals disposed at the periphery of said substrate; and first and second continuous conductive wires; one end of said first and second conductive wires bonded to portions of said first and second conductive strips; the opposite ends of said first and second strips bonded to said cathode electrode of said first thyristor and said anode electrode of said second thyristor; and a generally central region of each of said strips being bonded to said anode electrode of said first thyristor and said cathode electrode of said second thyristor.

19. The solid state relay of claim 18, which further includes third and fourth conductive strips on said substrate; each of said third and fourth strips extending to third and fourth output terminals on the periphery of said substrate; said light emitting diode fixed to said third conductive strip and electrically connected to said fourth conductive strip whereby said diode is excited by application of an input voltage to said third and fourth terminals.

20. The solid state relay of claim 19, wherein said first, second, third and fourth terminals extend from the same side of said substrate.

21. The solid state relay of claim 19, wherein said first and third terminals extend from one side of said substrate and said second and fourth terminals extend from an opposite side of said substrate.

22. The solid state relay of claim 18 or 19, wherein said first and second control circuits include first and second control transistors respectively, each having an output circuit and a transistor control circuit operable to switch its respective control circuit between a conductive and a nonconductive condition; and first and second capacitor dividers respectively; said first and second transistor output circuits connected between said gate circuit and said cathode electrode of its respective one of said first and second thyristors, whereby, when said first or second transistor output circuit is conductive, the respective one of said first or second thyristors cannot fire in response to illumination of its said first surface; said first and second capacitor dividers connected across said pair of a.c. terminals and having respective nodes between capacitors connected to said control circuit of the respective control transistor, whereby the voltage at said nodes renders its respective transistor conductive so long as the voltage between said a.c. terminals exceeds a given value to prevent turn on of the respective one of said thyristors when the a.c. voltage exceeds a given window voltage, and whereby fast rising transient pulses turn on said transistors for their duration to prevent turn on of said thyristors by transient high dV/dt pulsees.

23. The relay of claim 2, wherein said first and second transistors respectively and said first and second voltage dividers respectively are integrally formed in said first and second chips.

24. The relay of claim 22, wherein said first and second transistors respectively and said first and second voltage dividers respectively are integrally formed in said first and second chips.

* * * * *